US012640212B2

(12) United States Patent
Lin et al.

(10) Patent No.: US 12,640,212 B2
(45) Date of Patent: May 26, 2026

(54) EFFICIENT EMPTY PAGE SCAN OPERATIONS

(71) Applicant: Micron Technology, Inc., Boise, ID (US)

(72) Inventors: Lei Lin, Fremont, CA (US); Peng Zhang, Los Altos, CA (US); Murong Lang, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 130 days.

(21) Appl. No.: 18/785,902

(22) Filed: Jul. 26, 2024

(65) Prior Publication Data

US 2026/0031161 A1    Jan. 29, 2026

(51) Int. Cl.
*G11C 16/34* (2006.01)
*G11C 16/26* (2006.01)

(52) U.S. Cl.
CPC .......... *G11C 16/3445* (2013.01); *G11C 16/26* (2013.01); *G11C 16/3418* (2013.01)

(58) Field of Classification Search
CPC ............................ G11C 16/3445; G11C 16/34
USPC ................................................... 365/185.22
See application file for complete search history.

(56) References Cited

U.S. PATENT DOCUMENTS 11,545,232 B1 * 1/2023 Sharifi Tehrani ........ G11C 7/20
2019/0018602 A1    1/2019 Koo et al.

2020/0075114 A1 * 3/2020 Lin ...................... G06F 11/1048
2023/0097679 A1    3/2023 Sharifi Tehrani et al.
2024/0061600 A1 * 2/2024 Zhang .................... G11C 29/42
2024/0220345 A1    7/2024 Kim

OTHER PUBLICATIONS

"International Application Serial No. PCT US2025 036980, International Search Report mailed Nov. 6, 2025", 3 pages.
"International Application Serial No. PCT US2025 036980, Written Opinion mailed Nov. 6, 2025", 3 pages.

* cited by examiner

*Primary Examiner* — Muna A Techane

(74) *Attorney, Agent, or Firm* — Schwegman Lundberg & Woessner, P.A.

(57) ABSTRACT

The present disclosure configures a system component, such as memory sub-system controller, to perform empty page scan operations. The controller, in response to a request to perform an empty page scan operation, identifies a portion of a set of memory components that is empty and ready to be programmed. The controller generates an order in which to perform the empty page scan operation for a plurality of regions of the identified portion of the set of memory components. The controller determines whether a first region of the plurality of regions in the order fails the empty page scan operation before a second region of the plurality of regions is scanned. The controller terminates the empty page scan operation early to prevent performing the empty page scan operation for one or more remaining regions of the plurality of regions of the identified portion.

20 Claims, 8 Drawing Sheets

400

405 ☐ IN RESPONSE TO A REQUEST TO PERFORM AN EMPTY PAGE SCAN OPERATION, IDENTIFY A PORTION OF A SET OF MEMORY COMPONENTS THAT IS EMPTY AND READY TO BE PROGRAMMED

410 ☐ GENERATE AN ORDER IN WHICH TO PERFORM THE EMPTY PAGE SCAN OPERATION FOR A PLURALITY OF REGIONS OF THE IDENTIFIED PORTION OF THE SET OF MEMORY COMPONENTS

415 ☐ DETERMINE WHETHER A FIRST REGION OF THE PLURALITY OF REGIONS IN THE ORDER FAILS THE EMPTY PAGE SCAN OPERATION BEFORE A SECOND REGION OF THE PLURALITY OF REGIONS IS SCANNED

420 ☐ TERMINATE THE EMPTY PAGE SCAN OPERATION EARLY TO PREVENT PERFORMING THE EMPTY PAGE SCAN OPERATION FOR ONE OR MORE REMAINING REGIONS OF THE PLURALITY OF REGIONS OF THE IDENTIFIED PORTION OF THE SET OF MEMORY COMPONENTS THAT IS EMPTY AND READY TO BE PROGRAMMED IN RESPONSE TO DETERMINING WHETHER THE FIRST REGION FAILS THE EMPTY PAGE SCAN OPERATION BEFORE PERFORMING THE EMPTY PAGE SCAN OPERATION FOR THE SECOND REGION

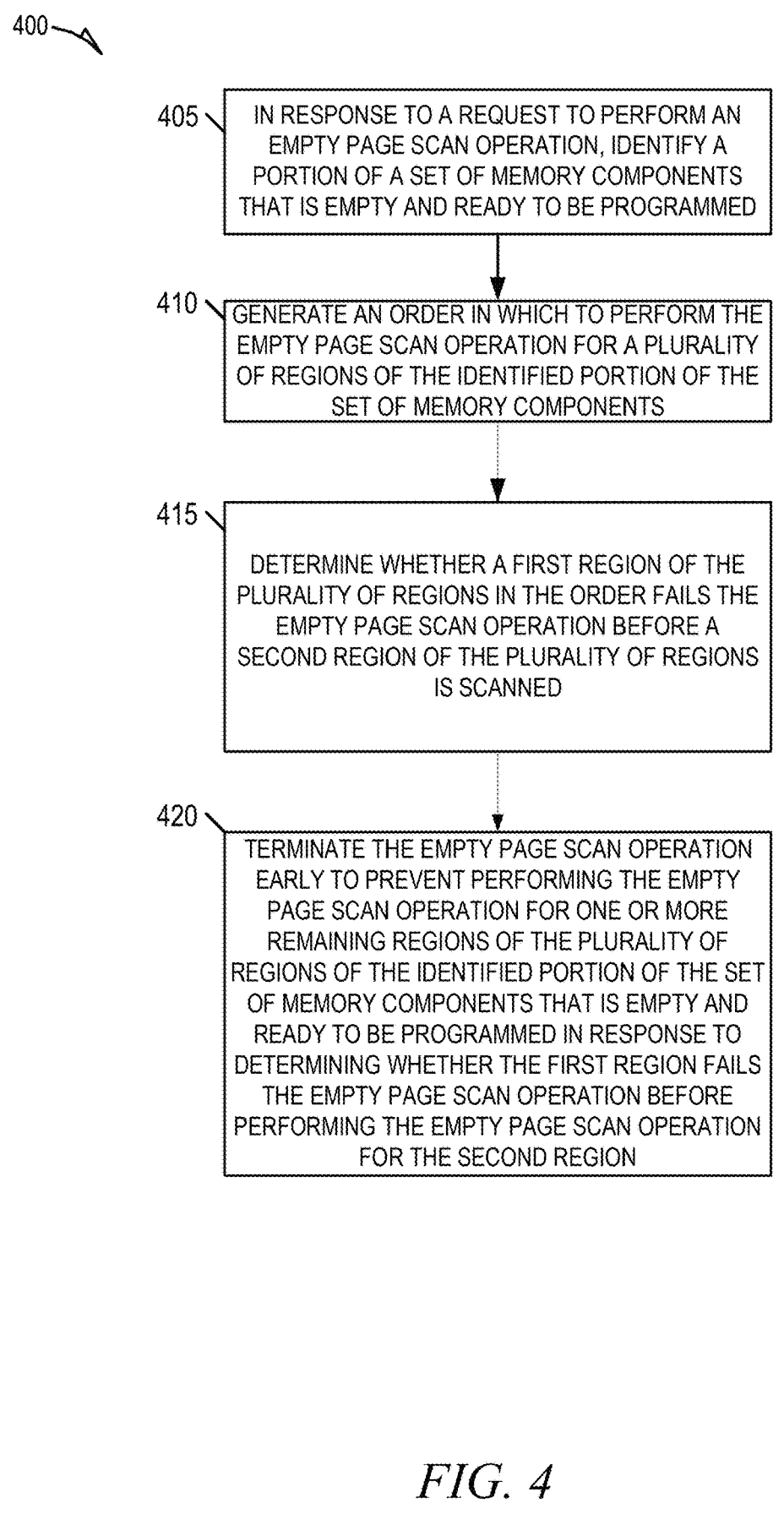

400

405 — IN RESPONSE TO A REQUEST TO PERFORM AN EMPTY PAGE SCAN OPERATION, IDENTIFY A PORTION OF A SET OF MEMORY COMPONENTS THAT IS EMPTY AND READY TO BE PROGRAMMED

410 — GENERATE AN ORDER IN WHICH TO PERFORM THE EMPTY PAGE SCAN OPERATION FOR A PLURALITY OF REGIONS OF THE IDENTIFIED PORTION OF THE SET OF MEMORY COMPONENTS

415 — DETERMINE WHETHER A FIRST REGION OF THE PLURALITY OF REGIONS IN THE ORDER FAILS THE EMPTY PAGE SCAN OPERATION BEFORE A SECOND REGION OF THE PLURALITY OF REGIONS IS SCANNED

420 — TERMINATE THE EMPTY PAGE SCAN OPERATION EARLY TO PREVENT PERFORMING THE EMPTY PAGE SCAN OPERATION FOR ONE OR MORE REMAINING REGIONS OF THE PLURALITY OF REGIONS OF THE IDENTIFIED PORTION OF THE SET OF MEMORY COMPONENTS THAT IS EMPTY AND READY TO BE PROGRAMMED IN RESPONSE TO DETERMINING WHETHER THE FIRST REGION FAILS THE EMPTY PAGE SCAN OPERATION BEFORE PERFORMING THE EMPTY PAGE SCAN OPERATION FOR THE SECOND REGION

*FIG. 4*

EFFICIENT EMPTY PAGE SCAN OPERATIONS

TECHNICAL FIELD

Examples of the disclosure relate generally to memory sub-systems and, more specifically, to performing empty page scanning operations in a memory sub-system.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various examples of the disclosure.

FIGS. 4-5 are flow diagrams of example methods to perform empty page scan operations, in accordance with some examples.

DETAILED DESCRIPTION

Figure 1:
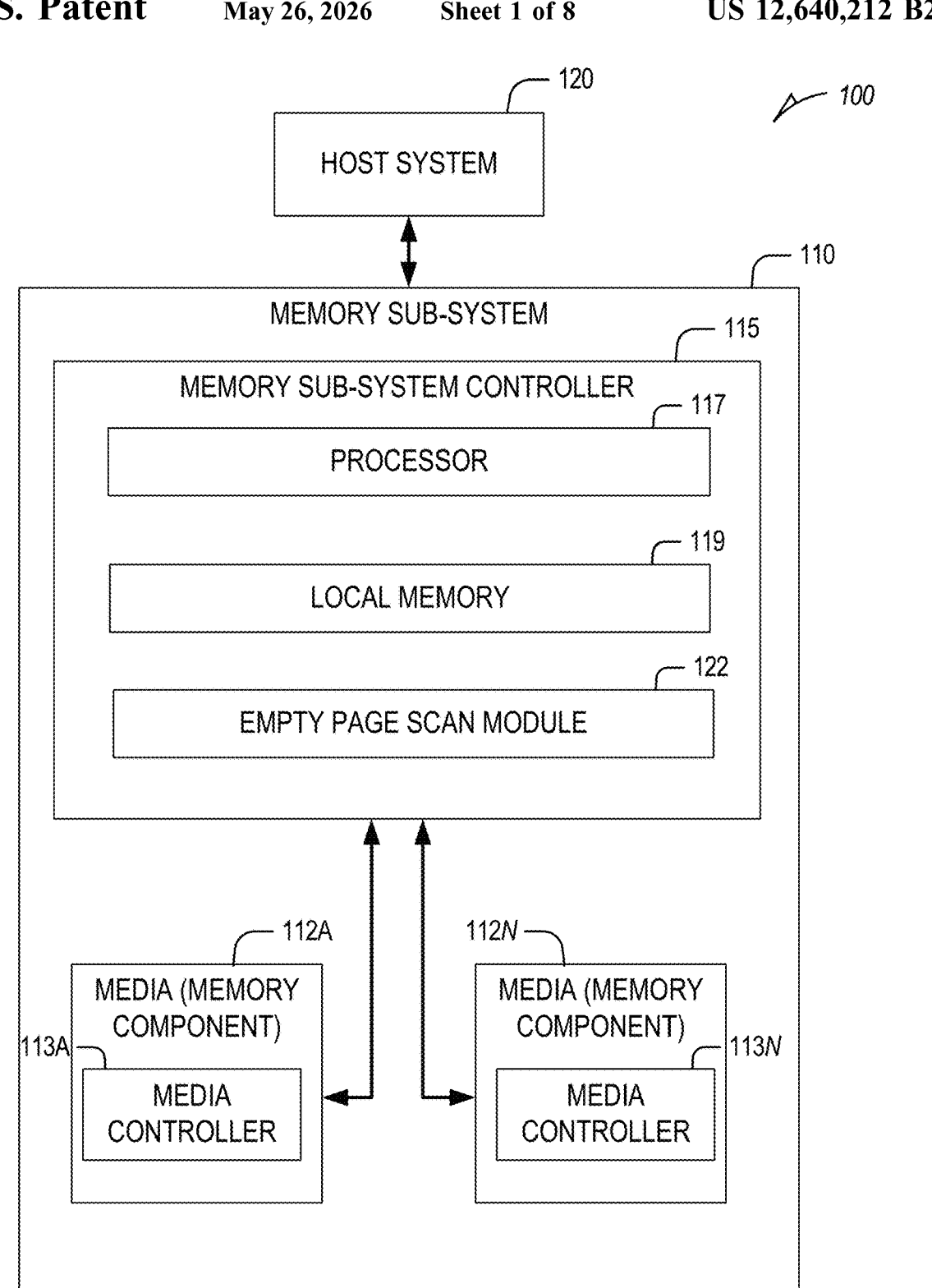
FIG. 1 is a block diagram illustrating an example computing environment including a memory sub-system, in accordance with some examples.

The present disclosure configures a system component, such as a memory sub-system controller, to performing empty page scanning operations for a memory sub-system. The memory sub-system controller can organize which regions of a specified portion of a set of memory components into a scan order according to a scan criterion. The controller can then initiate performing the empty page scanning operations according to the scan order and can terminate performing the empty page scanning operations early when any one of the regions fails the empty page scanning operations. In some cases, the scan criterion indicates the order in which sub-blocks (SBs) are scanned based on their respective reliability criterion. The scan criterion can indicate the order in which the SBs are scanned based on the sequence at which the SBs are programmed. The scan criterion can specify the order in which different word lines (WLs) are scanned based on their respective reliability criterion. By terminating the empty page scanning operations early when one of the regions fails the scan, the amount of time spent performing the empty page scanning operations can be reduced which improves the overall efficiency of operating the memory sub-system.

A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices that store data. The host system can send access requests (e.g., write command, read command, sequential write command, sequential read command) to the memory sub-system, such as to store data at the memory sub-system and to read data from the memory sub-system. The data specified by the host is hereinafter referred to as "host data" or "user data".

A host request can include logical address information (e.g., logical block address (LBA), namespace) for the host data, which is the location the host system associates with the host data and a particular zone in which to store or access the host data. The logical address information (e.g., LBA, namespace) can be part of metadata for the host data. Metadata can also include error handling data (e.g., ECC codeword, parity code), data version (e.g., used to distinguish age of data written), valid bitmap (which LBAs or logical transfer units contain valid data), etc.

The memory sub-system can initiate media management operations, such as a write operation, on host data that is stored on a memory device. For example, firmware of the memory sub-system may re-write previously written host data from a location on a memory device to a new location as part of garbage collection management operations. The data that is re-written, for example as initiated by the firmware, is hereinafter referred to as "garbage collection data".

"User data" can include host data and garbage collection data. "System data" hereinafter refers to data that is created and/or maintained by the memory sub-system for performing operations in response to host requests and for media management. Examples of system data include, and are not limited to, system tables (e.g., logical-to-physical address mapping table), data from logging, scratch pad data, etc.

A memory device can be a non-volatile memory device. A non-volatile memory device is a package of one or more dice. Each die can comprise one or more planes. For some types of non-volatile memory devices (e.g., NAND devices), each plane comprises a set of physical blocks. For some memory devices, blocks are the smallest area that can be erased. Each block comprises a set of pages. Each page comprises a set of memory cells, which store bits of data. The memory devices can be raw memory devices (e.g., NAND), which are managed externally, for example, by an external controller. The memory devices can be managed memory devices (e.g., managed NAND), which is a raw memory device combined with a local embedded controller for memory management within the same memory device package. The memory device can be divided into one or more zones where each zone is associated with a different set of host data or user data or application.

Conventional memory sub-systems maintain a list of empty pages or blocks which are portions of memory that have previously been erased and are valid for programming or writing data. Sometimes, these portions of memory are subject to leakage in current or voltage. The result of such leaks can cause the portions of memory previously indicated to be empty to erroneously reflect storage of information. This is because rather than storing a current or voltage distribution that represents a value of '1' when read (indicating an empty bit), they store a current or voltage distribution representing a value of '0' when read (erroneously indicating a programmed bit). To detect such errors, conventional memory sub-systems perform empty page scan operations. These operations involve reading a distribution of current or voltage from a portion of memory previously indicated to be empty to determine whether the portion still reflects an empty state. If the portion no longer reflects an empty state, that portion is refreshed or sent for re-erasure. The frequency and order at which the empty portions of memory are analyzed by the empty page scanning operations are usually predetermined and the same across all the memory blocks. This can lead to inefficiencies as certain memory blocks are never prone to empty state errors or leakage. Therefore, applying a one-size-fits-all approach to empty page scanning operations can be wasteful and inefficient which ends up slowing down memory operations.

The present disclosure addresses the above and other deficiencies by configuring a system component, such as a memory sub-system controller, to tailor the order of regions that are scanned or for which empty page scanning is performed based on various criteria and can terminate the scan early if any region fails the scan. Specifically, the memory sub-system controller can organize which regions of a specified portion of a set of memory components into a scan order according to a scan criterion. The memory sub-system controller can then initiate performing the empty page scanning operations according to the scan order and can terminate performing the empty page scanning operations early when any one of the regions fails the empty page scanning operations. By terminating the empty page scanning operations early when one of the regions fails the scan, the amount of time spent performing the empty page scanning operations can be reduced which improves the overall efficiency of operating the memory sub-system.

In some examples, the memory sub-system controller receives a request to perform an empty page scan operation(s). The memory sub-system controller, in response to a request to perform an empty page scan operation, identifies a portion of the set of memory components that is empty and ready to be programmed. The memory sub-system controller generates an order in which to perform the empty page scan operation for a plurality of regions of the identified portion of the set of memory components and determines whether a first region of the plurality of regions in the order fails the empty page scan operation before a second region of the plurality of regions is scanned. The memory sub-system controller terminates the empty page scan operation early to prevent performing the empty page scan operation for one or more remaining regions of the plurality of regions of the identified portion of the set of memory components that is empty and ready to be programmed in response to determining whether the first region fails the empty page scan operation before performing the empty page scan operation for the second region.

The memory sub-system controller can read one or more signals from the first region and access a read trim value for reading data from the first region. The memory sub-system controller compares the one or more signals to the read trim value to generate an error count value including computing a quantity of zeros that result from reading the one or more signals. The memory sub-system controller compares the quantity of zeros to a threshold value. In some cases, the memory sub-system controller adds an offset to the read trim value based on configuration information associated with the memory sub-system. In some cases, the memory sub-system controller, in response to determining that the quantity of zeros transgresses the threshold value, determines that the first region is valid for programming and performs the empty page scan operation a next region in the order including the second region.

The memory sub-system controller can, in response to determining that the quantity of zeros fails to transgress the threshold value, determine that the portion of the set of memory components is invalid for programming. In such cases, the memory sub-system controller flags the identified portion to be refreshed. The memory sub-system controller identifies a partially programmed block including a first set of pages of a plurality of pages that have been programmed. The memory sub-system controller selects a page of the plurality of pages that is adjacent to a last page of the set of pages as the portion of the set of memory components. The memory sub-system can include a three-dimensional (3D) NAND storage device.

In some examples, the memory sub-system controller accesses configuration information associated with the memory sub-system to identify a set of SBs that have an erasure reliability value that is below a threshold. The plurality of regions includes the set of SBs and the memory sub-system controller arranges the set of SBs in the order according to the erasure reliability value of the set of SBs. The memory sub-system controller performs the empty page scan operation for the set of SBs according to order. The identified portion can include the set of SBs arranged in a predetermined order. The order in which the set of SBs is arranged for performing the empty page scan operation can differ from the predetermined order in which the set of SBs is arranged.

In some cases, the memory sub-system controller accesses configuration information associated with the memory sub-system to identify a predetermined sequence in which a set of SBs is programmed with data. The plurality of regions includes the set of SBs and the memory sub-system controller arranges the set of SBs in the order according to the predetermined sequence in which the set of SBs is programmed with data. The memory sub-system controller can perform the empty page scan operation for the set of SBs according to order.

In some examples, the memory sub-system controller accesses configuration information associated with the memory sub-system to identify a set of WLs that have an erasure reliability value that is below a threshold. The plurality of regions includes the set of WLs and the memory sub-system controller can arrange the set of WLs in the order according to the erasure reliability value of the set of WLs. The memory sub-system controller performs the empty page scan operation for the set of WLs according to order. The plurality of regions can include different planes of a memory sub-system. The plurality of regions can include different memory dies.

Though various examples are described herein as being implemented with respect to a memory sub-system (e.g., a controller of the memory sub-system), some or all of the portions of an example can be implemented with respect to a host system, such as a software application or an operating system of the host system.

FIG. 1 illustrates an example computing environment 100 including a memory sub-system 110, in accordance with some examples. The memory sub-system 110 can include media, such as memory components 112A to 112N (also hereinafter referred to as "memory devices"). The memory components 112A to 112N can be volatile memory devices, non-volatile memory devices, or a combination of such. In some examples, the memory sub-system 110 is a storage system. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to a memory system. The memory system can include one or more memory sub-systems 110. In some examples, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, a compute express link (CXL), a universal serial bus (USB) interface, a Fibre Channel interface, a Serial Attached SCSI (SAS) interface, etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe or CXL interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND)-type flash memory. Each of the memory components 112A to 112N can include one or more arrays of memory cells such as single-level cells (SLCs) or multi-level cells (MLCs) (e.g., TLCs or QLCs). In some examples, a particular memory component 112 can include both an SLC portion and an MLC portion of memory cells. Each of the memory cells can store one or more bits of data (e.g., blocks) used by the host system 120. Although non-volatile memory components such as NAND-type flash memory are described, the memory components 112A to 112N can be based on any other type of memory, such as a volatile memory.

In some examples, the memory components 112A to 112N can be, but are not limited to, random access memory (RAM), read-only memory (ROM), dynamic random access memory (DRAM), synchronous dynamic random access memory (SDRAM), phase change memory (PCM), magnetoresistive random access memory (MRAM), negative-or (NOR) flash memory, electrically erasable programmable read-only memory (EEPROM), three-dimensional (3D) NAND, and a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased. Furthermore, the memory cells of the memory components 112A to 112N can be grouped as memory pages or blocks that can refer to a unit of the memory component 112 used to store data.

The memory sub-system controller 115 can communicate with the memory components 112A to 112N to perform operations such as reading data, writing data, or erasing data at the memory components 112A to 112N and other such operations. The memory sub-system controller 115 can include hardware such as one or more integrated circuits and/or discrete components, a buffer memory, or a combination thereof. The memory sub-system controller 115 can be a microcontroller, special-purpose logic circuitry (e.g., a field programmable gate array (FPGA), an application specific integrated circuit (ASIC), etc.), or another suitable processor. The memory sub-system controller 115 can include a processor 117 (processing device) configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120. In some examples, the local memory 119 can include memory registers storing memory pointers, fetched data, and so forth. The local memory 119 can also include read-only memory (ROM) for storing microcode. While the example memory sub-system 110 in FIG. 1 has been illustrated as including the memory sub-system controller 115, in another example of the present disclosure, a memory sub-system 110 may not include a memory sub-system controller 115, and can instead rely upon external control (e.g., provided by an external host, or by a processor 117 or controller separate from the memory sub-system 110).

In general, the memory sub-system controller 115 can receive I/O commands or operations from the host system 120 and can convert the commands or operations into instructions or appropriate commands to achieve the desired access to the memory components 112A to 112N. The memory sub-system controller 115 can be responsible for other operations, based on instructions stored in firmware in an active slot or associated with an active firmware slot, such as wear leveling operations, garbage collection operations, error detection and ECC operations, decoding operations, encryption operations, caching operations, address translations between a logical block address and a physical block address that are associated with the memory components 112A to 112N, address translations between an application identifier received from the host system 120 and a corresponding zone of a set of zones of the memory components 112A to 112N. This can be used to restrict applications to reading and writing data only to/from a corresponding zone of the set of zones that is associated with the respective applications. In such cases, even though there may be free space elsewhere on the memory components 112A to 112N, a given application can only read/write data to/from the associated zone, such as by erasing data stored in the zone and writing new data to the zone. The memory sub-system controller 115 can further include host interface circuitry to communicate with the host system 120 via the physical host interface. The host interface circuitry can convert the I/O commands received from the host system 120 into command instructions to access the memory components 112A to 112N as well as convert responses associated with the memory components 112A to 112N into information for the host system 120.

The memory sub-system 110 can also include additional circuitry or components that are not illustrated. In some examples, the memory sub-system 110 can include a cache or buffer (e.g., DRAM or other temporary storage location or device) and address circuitry (e.g., a row decoder and a column decoder) that can receive an address from the memory sub-system controller 115 and decode the address to access the memory components 112A to 112N.

The memory devices can be raw memory devices (e.g., NAND), which are managed externally, for example, by an external controller (e.g., memory sub-system controller 115). The memory devices can be managed memory devices (e.g., managed NAND), which is a raw memory device combined with a local embedded controller (e.g., local media controllers) for memory management within the same memory device package. Any one of the memory components 112A to 112N can include a media controller (e.g., media controller 113A and media controller 113N) to manage the memory cells of the memory component, to communicate with the memory sub-system controller 115, and to execute memory requests (e.g., read or write) received from the memory sub-system controller 115.

In some examples, the memory sub-system controller 115 can include an empty page scan module 122. The empty page scan module 122 can organize which regions of a specified portion of a set of memory components into a scan order according to a scan criterion. The empty page scan module 122 can then initiate performing the empty page scanning operations according to the scan order and can terminate performing the empty page scanning operations early when any one of the regions fails the empty page scanning operations. In some cases, the scan criterion indicates the order in which SBs are scanned based on their respective reliability criterion. The scan criterion can indicate the order in which the SBs are scanned based on the sequence at which the SBs are programmed. The scan criterion can specify the order in which different WLs are scanned based on their respective reliability criterion. By terminating the empty page scanning operations early when one of the regions fails the scan, the amount of time spent performing the empty page scanning operations can be reduced which improves the overall efficiency of operating the memory sub-system 110.

For example, the empty page scan module 122 can, in response to a request to perform an empty page scan operation, identify a portion of a set of memory components 112A to 112N that is empty and ready to be programmed. The empty page scan module 122 generates an order in which to perform the empty page scan operation for a plurality of regions of the identified portion of the set of memory components. The empty page scan module 122 determines whether a first region of the plurality of regions in the order fails the empty page scan operation before a second region of the plurality of regions is scanned. The empty page scan module 122 terminates the empty page scan operation early to prevent performing the empty page scan operation for one or more remaining regions of the plurality of regions of the identified portion.

Depending on the example, the empty page scan module 122 can comprise logic (e.g., a set of transitory or non-transitory machine instructions, such as firmware) or one or more components that causes the memory sub-system 110 (e.g., the memory sub-system controller 115) to perform operations described herein with respect to the empty page scan module 122. The empty page scan module 122 can comprise a tangible or non-tangible unit capable of performing operations described herein.

Figure 2:
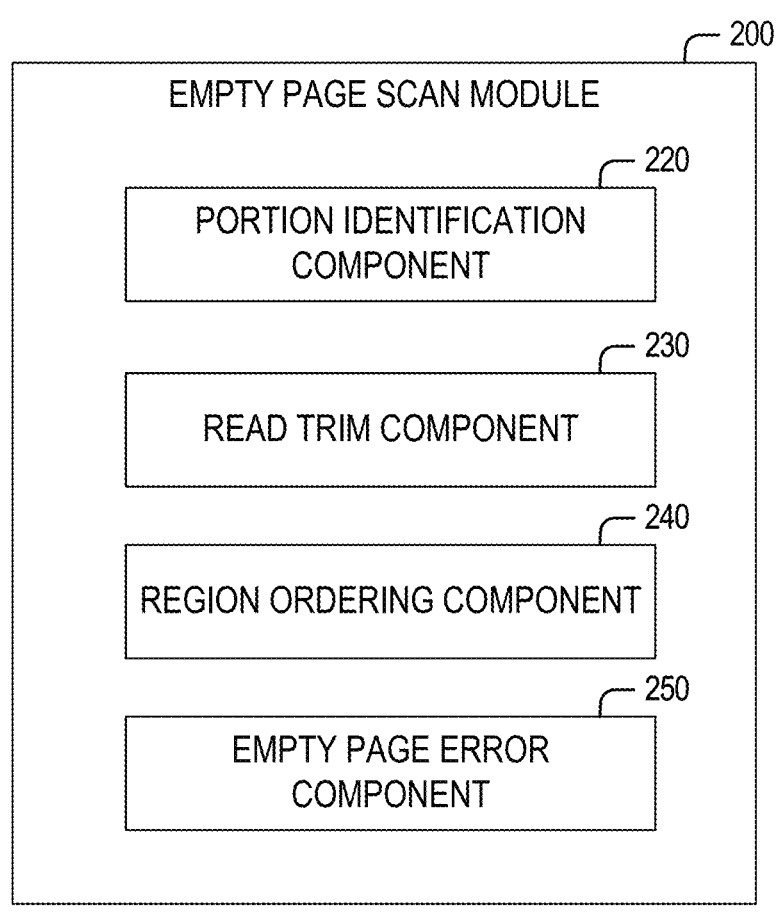
FIG. 2 is a block diagram of an example empty page scan module, in accordance with some examples.

FIG. 2 is a block diagram of an example empty page scan module 200, in accordance with some examples. The empty page scan module 200 can represent the empty page scan module 122 of FIG. 1. As illustrated, the empty page scan module 200 includes a portion identification component 220, a read trim component 230, a region ordering component 240, and an empty page error component 250.

The portion identification component 220 accesses a page table or block table to identify one or more portions of the set of memory components 112A to 112N that are currently set to the empty state. Namely, the portion identification component 220 identifies a portion that has previously been erased and is currently ready to be programmed. In some cases, the portion corresponds to an entire block that includes multiple empty pages. In some cases, the portion corresponds to a page within a block of which a portion has been previously programmed. Namely, the block can include a plurality of pages and some but not all of the pages may have been programmed. In such cases, the portion identification component 220 identifies the last page of the block that has been programmed and selects the next adjacent page to the last page that is currently empty. In some cases, the portion identification component 220 performs these operations in response to receiving, accessing, and/or generating a request to perform one or more empty page scanning operations (e.g., NAND detect empty page (NDEP) scan operations).

The portion identification component 220 provides the identification of the selected portion to the empty page error component 250 for analysis. The empty page error component 250 receives an instruction to perform empty page scanning operations on empty pages. The empty page error component 250 communicates the identified portion of the set of memory components 112A to 112N to the region ordering component 240. The region ordering component 240 can access one or more criteria for ordering, sequencing, and/or organizing the scan sequence for different regions (e.g., SBs, WLs, memory planes, and/or memory dies) of the identified portion.

For example, in some cases, the empty page error component 250 can access a table that lists SBs according to their respective reliability criteria. The reliability criteria can represent the erasure reliability value of each SB. The empty page error component 250 can use configuration information to identify the set of SBs that are indicated to be associated with an erasure reliability value that is below a threshold. Namely, the configuration information can be generated during manufacture and/or testing of the memory sub-system 110 to identify which SBs are prone to empty state errors. These are the SBs that can be accessed and tested by the empty page scanning operations to verify and determine failure of the selected portion in remaining in the empty state. The empty page error component 250 can prioritize the SBs according to their respective erasure reliability values. For example, the empty page error component 250 can place SBs with worse erasure reliability values (e.g., indicating a greater likelihood of failing the NDEP scan operations) earlier in the order or list and can place SBs with better erasure reliability values (e.g., indicating a lower likelihood of failing the NDEP scan operations) later in the order or list. The empty page error component 250 can provide this list of SBs that orders the SBs to the empty page error component 250. The empty page error component 250 can then perform the empty page scanning operations on the SBs of the identified region according to the order in the list.

For example, in some cases, the empty page error component 250 can access configuration information that indicates the sequence or pattern in which data is programmed in the identified portion. The empty page error component 250 can organize or order the SBs according to the sequence or pattern in which the data is programed in a list and provide this list of ordered SBs to the empty page error component 250. The empty page error component 250 can then perform the empty page scanning operations on the SBs of the identified region according to the order in the list.

For example, in some cases, the empty page error component 250 can access a table that lists WLs according to their respective reliability criteria. The reliability criteria can represent the erasure reliability value of each WL. The empty page error component 250 can use configuration information to identify the set of WLs that are indicated to be associated with an erasure reliability value that is below a threshold. Namely, the configuration information can be generated during manufacture and/or testing of the memory sub-system 110 to identify which WLs are prone to empty state errors. These are the WLs that can be accessed and tested by the empty page scanning operations to verify and determine failure of the selected portion in remaining in the empty state. The empty page error component 250 can prioritize the WLs according to their respective erasure reliability values. For example, the empty page error component 250 can place WLs with worse erasure reliability values (e.g., indicating a greater likelihood of failing the NDEP scan operations) earlier in the order or list and can place WLs with better erasure reliability values (e.g., indicating a lower likelihood of failing the NDEP scan operations) later in the order or list. The empty page error component 250 can provide this list of WLs that orders the WLs to the empty page error component 250. The empty page error component 250 can then perform the empty page scanning operations on the WLs of the identified region according to the order in the list.

The empty page error component 250 communicates with the read trim component 230. The empty page error component 250 obtains from the read trim component 230 a current default read trim value associated with the memory sub-system 110. The read trim value represents a particular current and/or voltage distribution that needs to be stored in a given cell or bitline in order to read a logic value of '0' from the given cell. If the current and/or voltage distribution transgresses the read trim value, the current and/or voltage distribution can be determined to correspond to a logic value of '1' and otherwise the current and/or voltage distribution is determined to correspond to a logic value of '0' or vice versa. The read trim component 230 can store the default read trim value by accessing configuration information associated with the memory sub-system 110.

The empty page error component 250 adds an offset to the read trim value received from the read trim component 230.

The empty page error component 250 can select a first region in the list of regions received from the region ordering component 240 for scanning. The empty page error component 250 retrieves the current and/or voltage distribution signals from the first region. The empty page error component 250 compares the current and/or voltage distribution signals from the first region to the read trim value to which the offset has been added. The empty page error component 250 can compute an error count value based on the comparison. The error count value can represent whether the selected portion that includes the first region is valid for programming. For example, the error count value can indicate a quantity of logical '0' values that have been read from the first region of the selected portion.

In some examples, the empty page error component 250 compares the quantity of logical 'O' values to a threshold value to determine whether the first region is valid for programming. In response to determining that the quantity of logical '0' values exceed or transgress the threshold, the empty page error component 250 determines that the first region is invalid for programming and can cause the portion that includes the first region and the other regions to be refreshed (e.g., sent to be erased again). In this case, the empty page error component 250 can prevent performing empty page scanning operations for other regions of the identified portion of the set of memory components 112A to 112N. For example, the empty page error component 250 can terminate the NDEP scan early and can prevent scanning the second region of the regions of the identified portion if the first region fails the NDEP scan operation. In response to determining that the quantity of logical '0' values fails to exceed or transgress the threshold, the empty page error component 250 determines that the selected portion is still valid for programming. In such cases, the empty page error component 250 communicates with the region ordering component 240 to select a second region that is next in the list of ordered regions for performing the empty page scanning operation.

Figure 3A:
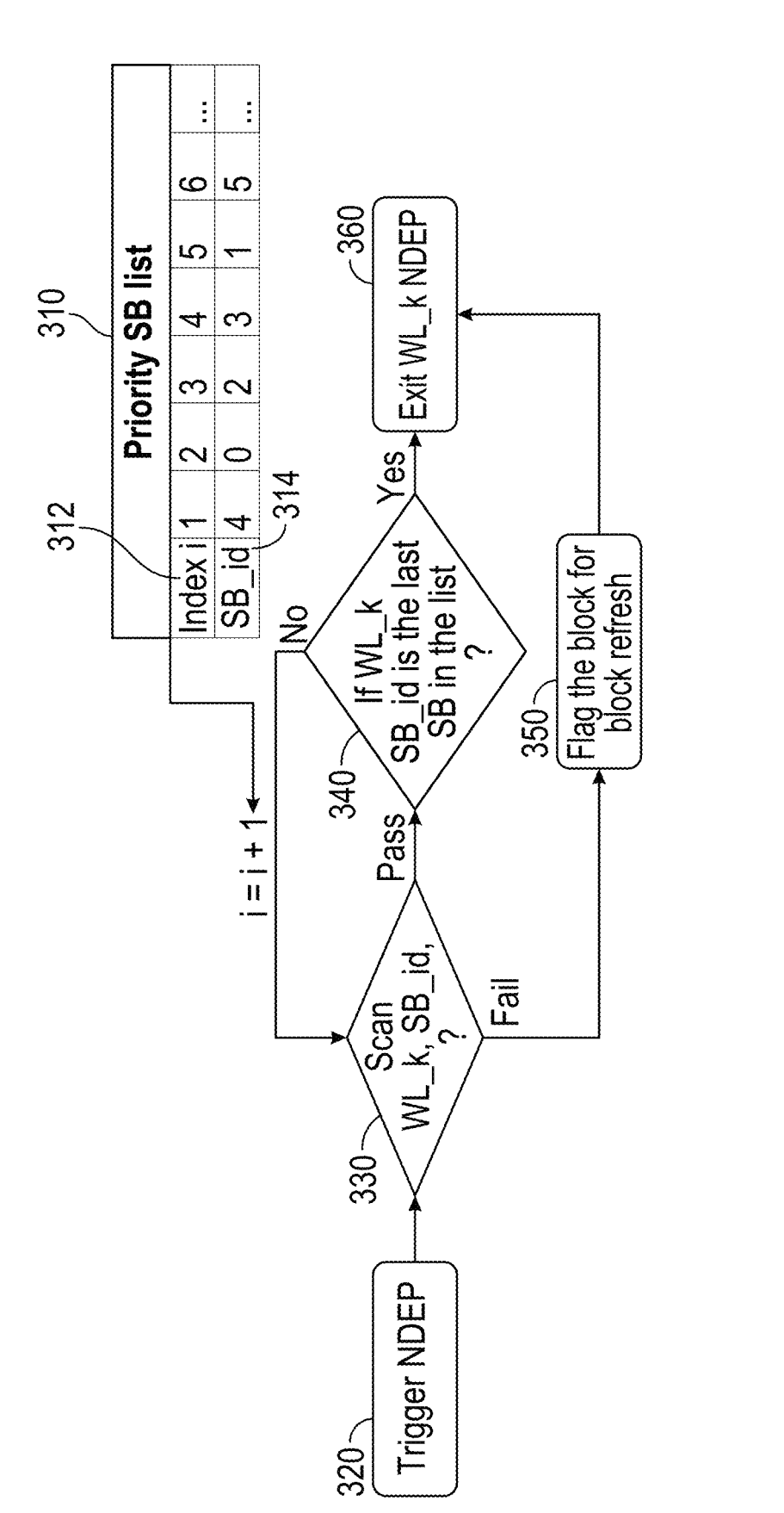
FIGS. 3A-3C are block diagrams of example region ordering criteria, in accordance with some examples.

FIG. 3A is a block diagram 300 of an example region ordering criterion, in accordance with some examples. Specifically, the region ordering component 240 can receive an identification of a portion of the set of memory components 112A to 112N to be scanned by the NDEP scan operations. The region ordering component 240 can access a table 310 that lists each of the SBs of different portions of the set of memory components 112A to 112N. The SBs can be listed in the table 310 according to their respective erasure reliability values. The table 310 can associate an index 312 (e.g., that controls the order of scanning of the SBs) with each SB identifier 314.

For example, the last SB (e.g., SB6) of the portion of the set of memory components 112A to 112N can be associated with a first index value (e.g., index value 1). This can cause the last SB to be scanned by the NDEP scan operations first. The first SB (e.g., SB6) of the portion of the set of memory components 112A to 112N can be associated with a last index value (e.g., index value 6). This can cause the first SB to be scanned by the NDEP scan operations last. In this way, the NDEP scan operations can be performed on the SBs of the portion of the set of memory components 112A to 112N in a different order than the predetermined order in which the SBs of the portion are arranged.

Specifically, the empty page error component 250 can provide the table 310 to the empty page error component 250. The empty page error component 250 can trigger the NDEP scan 320 for the identified portion that includes multiple regions (e.g., different SBs). The empty page error component 250 can initialize the index counter to a starting value, such as the index value 1. The empty page error component 250 can access the table 310 can retrieve the SB identifier corresponding to the current index counter value. The empty page error component 250 can scan the SB of the identified portion corresponding to the SB identifier at operation 330 and determine whether the SB being scanned passes or fails the NDEP scan.

The empty page error component 250 can determine that the SB passes the NDEP scan. In such cases, the empty page error component 250 performs operation 340 to determine if the SB of the WL being scanned is the last SB that needs to be scanned by the NDEP scan. If so, the empty page error component 250 terminates the NDEP scan operation at operation 360. If there are additional SBs to scan, the empty page error component 250 increments the index value and repeats operation 330 for the next SB in the table 310 corresponding to the incremented index value. The empty page error component 250 can determine that the current SB being scanned fails the NDEP scan operation. In response, the empty page error component 250 flags the portion of the set of memory components 112A to 112N for being refreshed at operation 350 and terminates the NDEP scan operation at operation 360 to prevent scanning any remaining regions. For example, if a third region in the table 310 has yet to be scanned because the index value has not reached the maximum value (e.g., a maximum value of 6), the third region and any subsequent regions will not be scanned by the NDEP scan operation if the current region (e.g., the second region in the table 310) fails the NDEP scan operation.

Figure 3B:
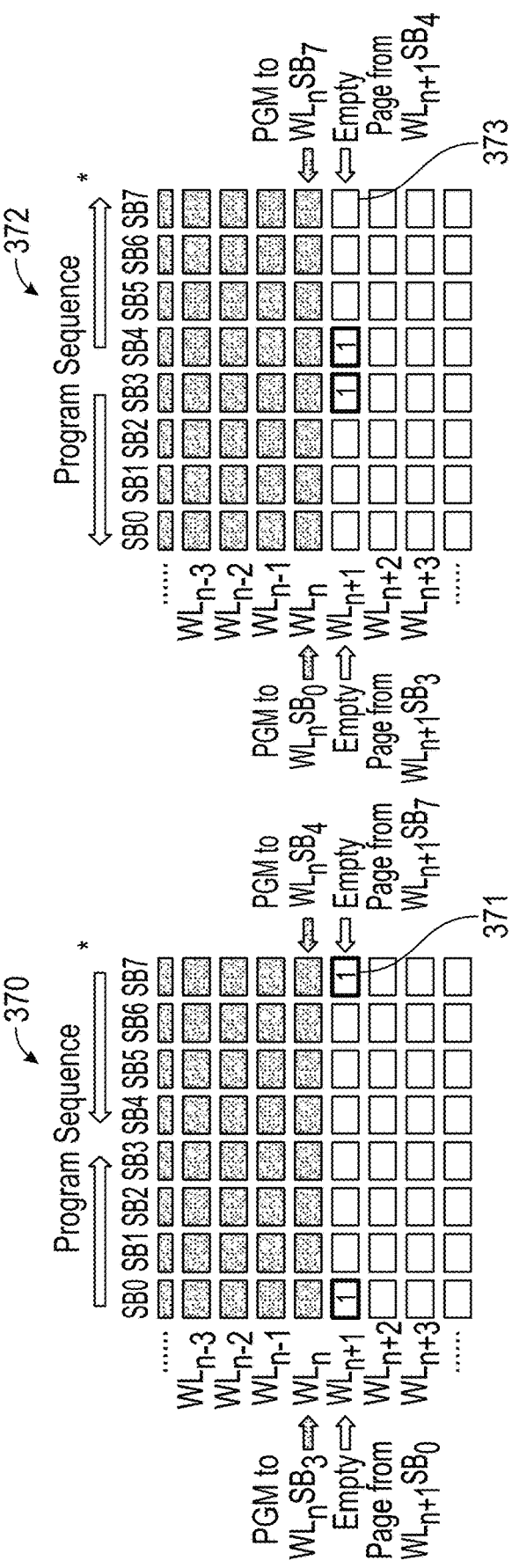

FIG. 3B is a block diagram 301 of an example region ordering criterion, in accordance with some examples. The region ordering component 240 can access configuration information to determine the sequence or order in which SBs are programmed with data. For example, the region ordering component 240 can determine that the SBs are programmed according to a first sequence 370. The first sequence 370 specifies that a first set of regions 371, such as SB0 and SB7 (e.g., the first and last SBs), are programmed with data first followed by SB1 and SB6 being programmed with data until SB3 and SB4 are programmed with data. In such cases, the region ordering component 240 generates an order of SBs for which to perform the NDEP scan operation corresponding to the first sequence 370. In such cases, the empty page error component 250 can first determine whether SB0 and SB7 pass or fail the NDEP scan operation. If the SB0 and SB7 regions fail the NDEP scan operation, the empty page error component 250 terminates the NDEP scan early and prevents scanning remaining regions (e.g., SB1, SB2, SB3, SB4, SB5, and SB6). If the SB0 and SB7 regions pass the NDEP scan operation, the empty page error component 250 then uses the order provided by the region ordering component 240 to perform the NDEP scan on the regions SB1 and SB6. The empty page error component 250 again determines if the regions SB1 and SB6 pass or fail the NDEP scan to selectively control terminating the NDEP scan operations early.

As another example, the region ordering component 240 can determine that the SBs are programmed according to a second sequence 372. The first sequence 370 specifies that a second set of regions 373, such as SB3 and SB4 are programmed with data first followed by SB2 and SB5 being programmed with data until SB0 and SB7 are programmed with data. In such cases, the region ordering component 240 generates an order of SBs for which to perform the NDEP scan operation corresponding to the second sequence 372. In such cases, the empty page error component 250 can first determine whether SB3 and SB4 regions pass or fail the NDEP scan operation. If the SB3 and SB4 regions fail the NDEP scan operation, the empty page error component 250 terminates the NDEP scan early and prevents scanning remaining regions. If the SB3 and SB4 regions pass the NDEP scan operation, the empty page error component 250 then uses the order provided by the region ordering component 240 to perform the NDEP scan on the regions SB2 and SB5. The empty page error component 250 again determines if the regions SB2 and SB5 pass or fail the NDEP scan to selectively control terminating the NDEP scan operations early.

Figure 3C:
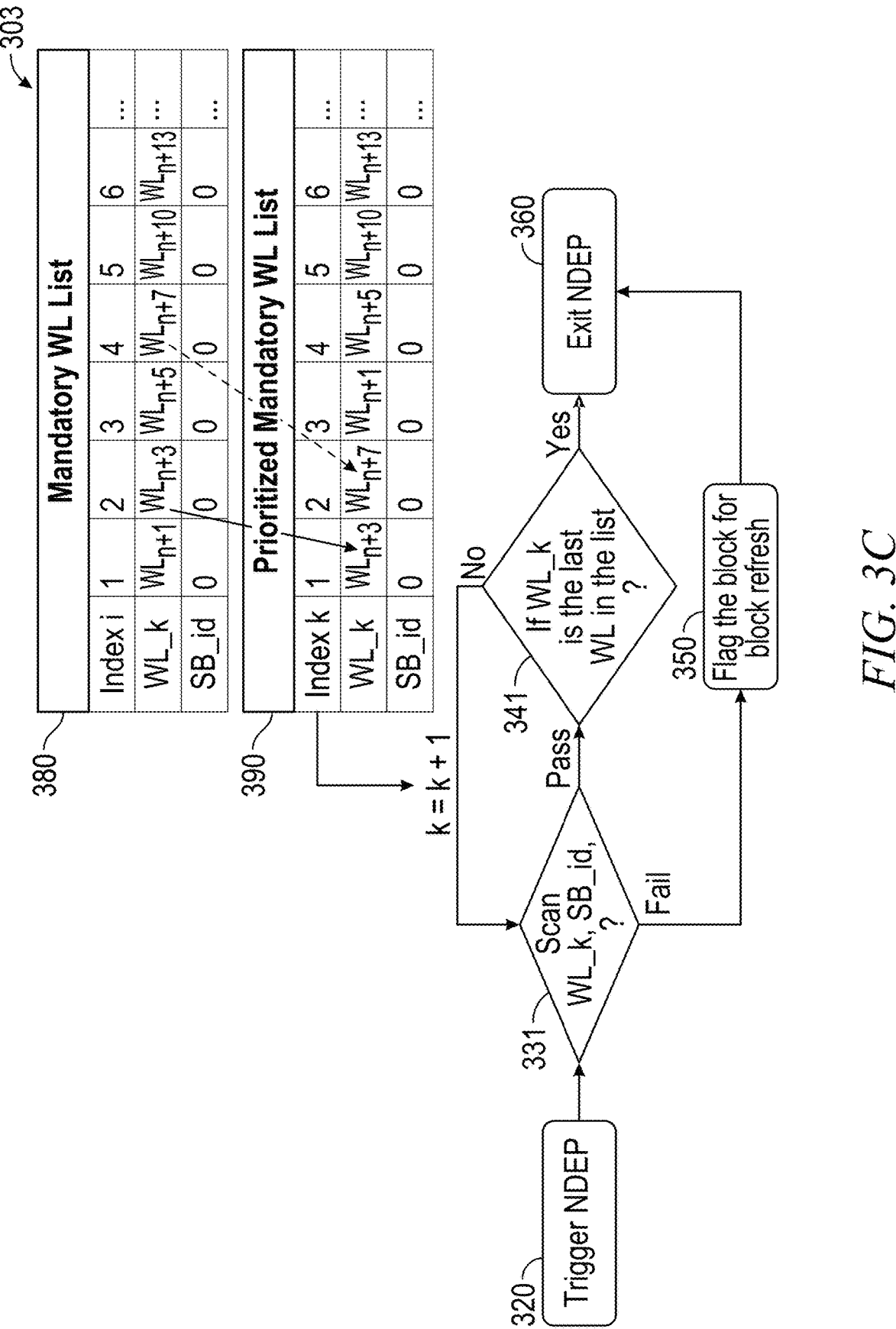

FIG. 3C is a block diagram 303 of an example region ordering criterion, in accordance with some examples. Specifically, the region ordering component 240 can receive an identification of a portion of the set of memory components 112A to 112N to be scanned by the NDEP scan operations. The region ordering component 240 can access a table 380 that lists WLs that have a low reliability value (e.g., have poor erasure reliability values). The region ordering component 240 can prioritize the WLs according to their reliability values by storing the table 390. The WLs can be listed in the table 390 according to their respective erasure reliability values. The table 390 can associate an index 392 (e.g., that controls the order of scanning of the WLs) with each WL identifier 394.

For example, a second WL (e.g., WLn+3) of the table 380 can be associated with a first index value (e.g., index value 1). This can cause the second WL to be scanned by the NDEP scan operations first. The fourth WL (e.g., WLn+7) of the table 380 can be associated with a second index value (e.g., index value 2). This can cause the fourth SB to be scanned by the NDEP scan operations second (e.g., after the second WL is scanned). In this way, the NDEP scan operations can be performed on the WLs of the portion of the set of memory components 112A to 112N in a different order than the predetermined order in which the WLs of the portion are arranged in the table 380.

Specifically, the empty page error component 250 can provide the table 390 to the empty page error component 250. The empty page error component 250 can trigger the NDEP scan 320 for the identified portion that includes multiple regions (e.g., different WLs). The empty page error component 250 can initialize the index counter to a starting value, such as the index value 1. The empty page error component 250 can access the table 390 can retrieve the WL identifier corresponding to the current index counter value. The empty page error component 250 can scan the SB of the retrieved WL identifier at operation 331 and determine whether the SB and/or WL being scanned passes or fails the NDEP scan.

The empty page error component 250 can determine that the WL passes the NDEP scan. In such cases, the empty page error component 250 performs operation 341 to determine if the WL of the WLs being scanned is the last WL that needs to be scanned by the NDEP scan. If so, the empty page error component 250 terminates the NDEP scan operation at operation 360. If there are additional WLs to scan, the empty page error component 250 increments the index value and repeats operation 331 for the next WL in the table 390 corresponding to the incremented index value. The empty page error component 250 can determine that the current WL being scanned fails the NDEP scan operation. In response, the empty page error component 250 flags the portion of the set of memory components 112A to 112N for being refreshed at operation 350 and terminates the NDEP scan operation at operation 360 to prevent scanning any remaining regions. For example, if a third region in the table 310 has yet to be scanned because the index value has not reached the maximum value (e.g., a maximum value of 6), the third region and any subsequent regions will not be scanned by the NDEP scan operation if the current region (e.g., the second region in the table 310) fails the NDEP scan operation.

FIG. 4 is a flow diagram of an example method 400 to perform empty page scan operations, in accordance with some examples. Method 400 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some examples, the method 400 is performed by the memory sub-system controller 115 or subcomponents of the controller 115 of FIG. 1. In these examples, the method 400 can be performed, at least in part, by the empty page scan module 200. Although the processes are shown in a particular sequence or order, unless otherwise specified, the order of the processes can be modified. Thus, the illustrated examples should be understood only as examples; the illustrated processes can be performed in a different order, and some processes can be performed in parallel. Additionally, one or more processes can be omitted in various examples. Thus, not all processes are required in every example. Other process flows are possible.

Referring now to FIG. 4, the method (or process) 400 begin at operation 405, with the empty page scan module 200 of a memory sub-system (e.g., of processor of the memory sub-system controller 115) in response to a request to perform an empty page scan operation, identifying a portion of a set of memory components that is empty and ready to be programmed. Then, at operation 410, the empty page scan module 200 generates an order in which to perform the empty page scan operation for a plurality of regions of the identified portion of the set of memory components 112A to 112N and, at operation 415, determines whether a first region of the plurality of regions in the order fails the empty page scan operation before a second region of the plurality of regions is scanned. The empty page scan module 200, at operation 420, terminates the empty page scan operation early to prevent performing the empty page scan operation for one or more remaining regions of the plurality of regions of the identified portion of the set of memory components 112A to 112N that is empty and ready to be programmed in response to determining whether the first region fails the empty page scan operation before performing the empty page scan operation for the second region.

Figure 5:
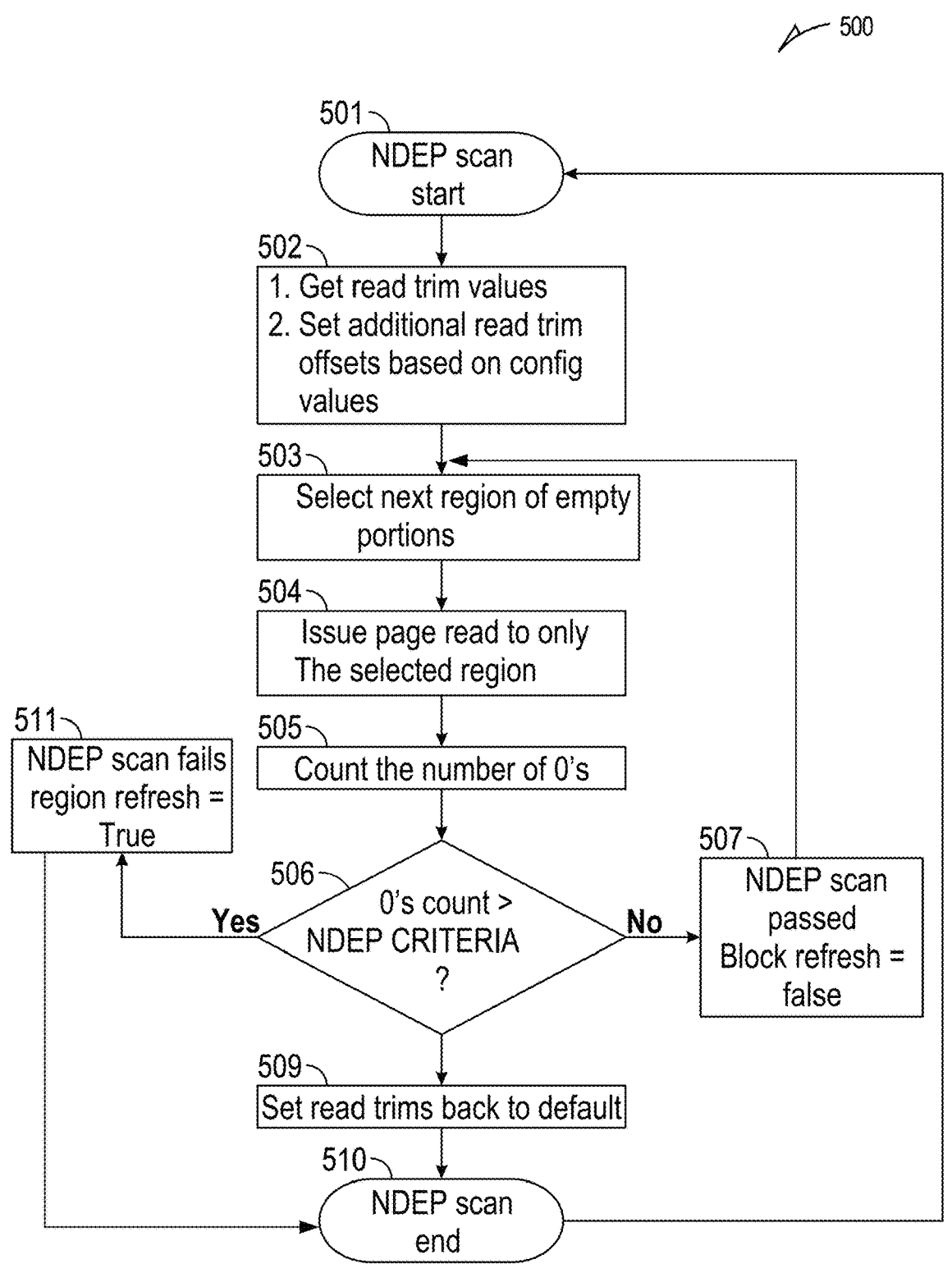

FIG. 5 is a flow diagram of an example method 500 to perform empty page scan operations, in accordance with some examples. Method 500 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some examples, the method 500 is performed by the memory sub-system controller 115 or subcomponents of the controller 115 of FIG. 1. In these examples, the method 500 can be performed, at least in part, by the empty page scan module 200. Although the processes are shown in a particular sequence or order, unless otherwise specified, the order of the processes can be modified. Thus, the illustrated examples should be understood only as examples; the illustrated processes can be performed in a different order, and some processes can be performed in parallel. Additionally, one or more processes can be omitted in various examples. Thus, not all processes are required in every example. Other process flows are possible.

Referring now to FIG. 5, the method (or process) 500 begin at operation 501, with the empty page scan module 200 of a memory sub-system (e.g., of processor of the memory sub-system controller 115) starting an NDEP scan operation (e.g., an empty page scan operation). Then, at operation 502, the empty page scan module 200 obtains read trim values (e.g., signal distribution thresholds) and sets read trim offsets based on previously stored and accessed configuration information. The empty page scan module 200, at operation 503, selects a next region (e.g., SB, WL, memory die, and/or memory plane) in an ordered list of regions provided by the region ordering component 240 of the identified portion and, at operation 504, issues page read requests to regions according to the specified order.

At operation 505, the empty page scan module 200 counts the number of 0's that result from reading one of the regions to generate an error count value. The empty page scan module 200, at operation 506, determines whether the error count value transgresses a threshold by comparing the quantity of O's that are counted or computed to a criterion or threshold. In response to determining that the error count value transgresses the threshold (e.g., the quantity of 0's is greater than the threshold value), the empty page scan module 200, at operation 511, marks the identified portion (e.g., block and/or page) for re-erasure or causes the identified portion to be erased again by performing refresh operations. The empty page scan module 200 then proceeds to operation 510 where the NDEP scan operation is terminated early to prevent scanning any remaining regions of the identified portion.

In response to determining that the error count value fails to transgress the threshold (e.g., the quantity of 0's is less than the threshold value), the empty page scan module 200, at operation 507, determines that the NDEP scan operation was successful and that the selected region is still empty and ready to be programmed. In such cases, the empty page scan module 200, returns to operation 503 (e.g., if there are additional regions remaining to be scanned by the NDEP scan operation) to select a next region in the list of regions of the identified portion.

At operation 509, the empty page scan module 200 sets the read trim values back to the default values and, at operation 510, the empty page scan module 200 ends the NDEP scan operation. Operation 509 can sometimes be combined with operation 510 and be included as part of operation 510.

In view of the disclosure above, various examples are set forth below. It should be noted that one or more features of an example, taken in isolation or combination, should be considered within the disclosure of this application.

Example 1: A system comprising: a memory sub-system comprising a set of memory components; and a processing device, operatively coupled to the set of memory components and configured to operations comprising: in response to a request to perform an empty page scan operation, identifying a portion of the set of memory components that is empty and ready to be programmed; generating an order in which to perform the empty page scan operation for a plurality of regions of the identified portion of the set of memory components; determining whether a first region of the plurality of regions in the order fails the empty page scan operation before a second region of the plurality of regions is scanned; and terminating the empty page scan operation early to prevent performing the empty page scan operation for one or more remaining regions of the plurality of regions of the identified portion of the set of memory components that is empty and ready to be programmed in response to determining whether the first region fails the empty page scan operation before performing the empty page scan operation for the second region.

Example 2. The system of Example 1, the operations comprising: reading one or more signals from the first region; accessing a read trim value for reading data from the first region; comparing the one or more signals to the read trim value to generate an error count value comprising computing a quantity of zeros that result from reading the one or more signals; and comparing the quantity of zeros to a threshold value.

Example 3. The system of Example 2, the operations comprising: adding an offset to the read trim value based on configuration information associated with the memory sub-system.

Example 4. The system of any one of Examples 2-3, the operations comprising: in response to determining that the quantity of zeros transgresses the threshold value, determining that the first region is valid for programming; and performing the empty page scan operation a next region in the order comprising the second region.

Example 5. The system of any one of Examples 2-4, the operations comprising: in response to determining that the quantity of zeros fails to transgress the threshold value: determining that the portion of the set of memory components is invalid for programming; and flagging the identified portion to be refreshed.

Example 6. The system of any one of Examples 1-5, the operations comprising: identifying a partially programmed block comprising a first set of pages of a plurality of pages that have been programmed; and selecting a page of the plurality of pages that is adjacent to a last page of the set of pages as the portion of the set of memory components.

Example 7. The system of any one of Examples 1-6, wherein the memory sub-system comprises a three-dimensional (3D) NAND storage device.

Example 8. The system of any one of Examples 1-7, operations comprising: accessing configuration information associated with the memory sub-system to identify a set of sub-blocks (SBs) that have an erasure reliability value that is below a threshold.

Example 9. The system of Example 8, wherein the plurality of regions comprises the set of SBs, the operations comprising: arranging the set of SBs in the order according to the erasure reliability value of the set of SBs; and performing the empty page scan operation for the set of SBs according to order.

Example 10. The system of Example 9, wherein the identified portion comprises the set of SBs arranged in a predetermined order, and wherein the order in which the set of SBs is arranged for performing the empty page scan operation differs from the predetermined order in which the set of SBs is arranged.

Example 11. The system of any one of Examples 1-10, the operations comprising: accessing configuration information associated with the memory sub-system to identify a predetermined sequence in which a set of sub-blocks (SBs) is programmed with data.

Example 12. The system of Example 11, wherein the plurality of regions comprises the set of SBs, the operations comprising: arranging the set of SBs in the order according to the predetermined sequence in which the set of SBs is programmed with data; and performing the empty page scan operation for the set of SBs according to order.

Example 13. The system of any one of Examples 1-12, wherein the operations comprise: accessing configuration information associated with the memory sub-system to identify a set of word lines (WLs) that have an erasure reliability value that is below a threshold.

Example 14. The system of Example 13, wherein the plurality of regions comprises the set of WLs, the operations comprising: arranging the set of WLs in the order according to the erasure reliability value of the set of WLs; and performing the empty page scan operation for the set of WLs according to order.

Example 15. The system of any one of Examples 1-15, wherein the plurality of regions comprises different planes.

Example 16. The system of any one of Examples 1-15, wherein the plurality of regions comprises different memory dies.

Methods and computer-readable storage medium with instructions for performing any one of the above Examples.

Figure 6:
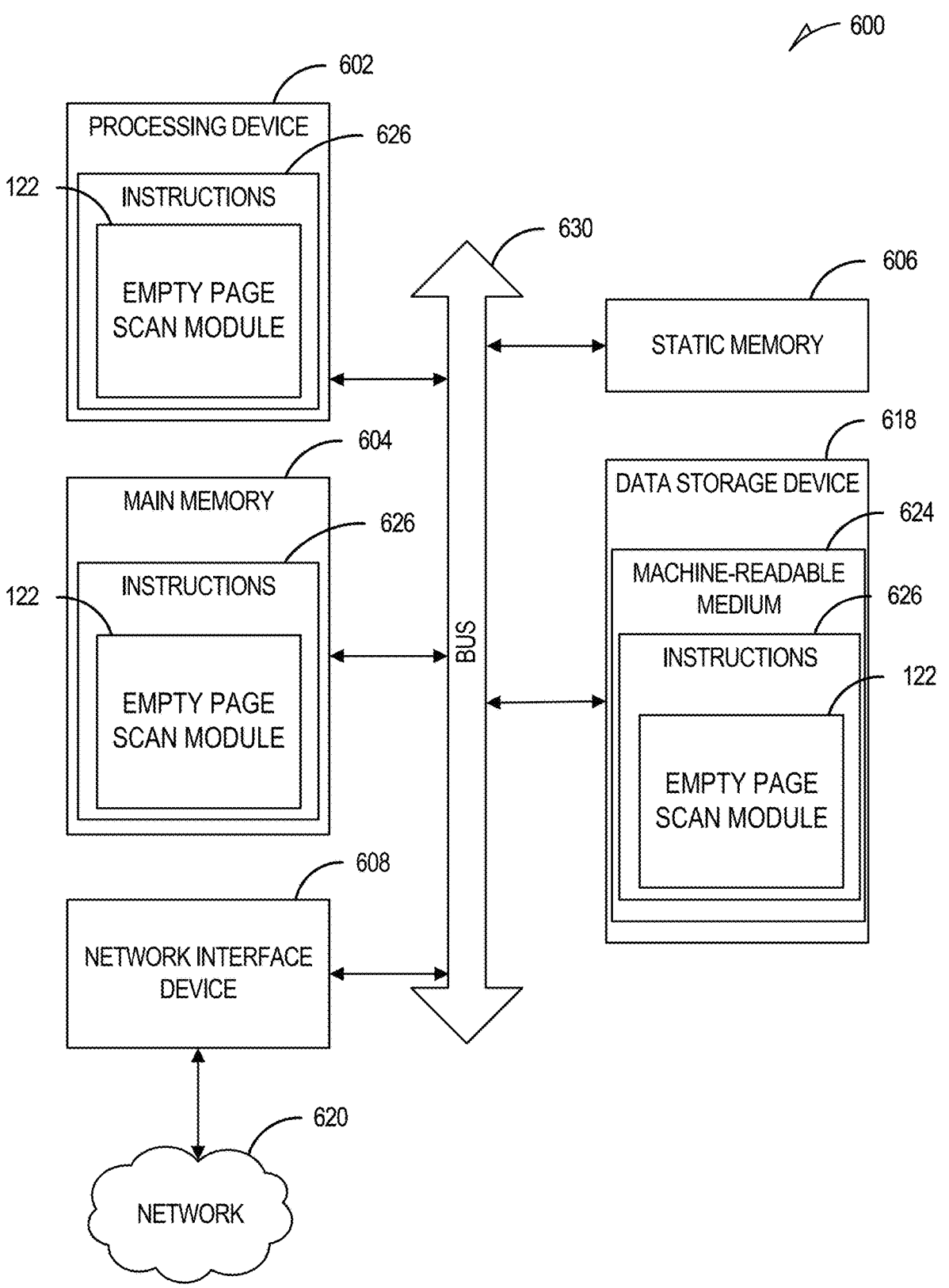
FIG. 6 is a block diagram illustrating a diagrammatic representation of a machine in the form of a computer system within which a set of instructions can be executed for causing the machine to perform any one or more of the methodologies discussed herein, in accordance with some examples.

FIG. 6 illustrates an example machine in the form of a computer system 600 within which a set of instructions can be executed for causing the machine to perform any one or more of the methodologies discussed herein. In some examples, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the empty page scan module 122 of FIG. 1). In alternative examples, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a network switch, a network bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage device 618, which communicate with each other via a bus 630.

The processing device 602 represents one or more general-purpose processing devices such as a microprocessor, a central processing unit, or the like. More particularly, the processing device 602 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), a network processor, or the like. The processing device 602 is configured to execute instructions 626 for performing the operations and steps discussed herein. The computer system 600 can further include a network interface device 608 to communicate over a network 620.

The data storage device 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage device 618, and/or main memory 604 can correspond to the memory sub-system 110 of FIG. 1.

In one example, the instructions 626 include instructions to implement functionality corresponding to firmware slot manager (e.g., the empty page scan module 122 of FIG. 1). While the machine-readable storage medium 624 is shown in an example to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system's memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks; read-only memories (ROMs); random access memories (RAMs); erasable programmable read-only memories (EPROMs); EEPROMs; magnetic or optical cards; or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description above. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some examples, a machine-readable (e.g., computer-readable) medium includes a machine-readable (e.g., computer-readable) storage medium such as a read-only memory (ROM), random access memory (RAM), magnetic disk storage media, optical storage media, flash memory components, and so forth.

In the foregoing specification, examples of the disclosure have been described with reference to specific examples thereof. It will be evident that various modifications can be made thereto without departing from the examples of the disclosure as set forth in the following claims. The specification and drawings are, accordingly, to be regarded in an illustrative sense rather than a restrictive sense.

What is claimed is:

1. A system comprising:
   a memory sub-system comprising a set of memory components; and
   a processing device, operatively coupled to the set of memory components and configured to operations comprising:
   in response to a request to perform an empty page scan operation, identifying a portion of the set of memory components that is empty and ready to be programmed;
   generating an order in which to perform the empty page scan operation for a plurality of regions of the identified portion of the set of memory components;
   determining whether a first region of the plurality of regions in the order fails the empty page scan operation before a second region of the plurality of regions is scanned; and terminating the empty page scan operation early to prevent performing the empty page scan operation for one or more remaining regions of the plurality of regions of the identified portion of the set of memory components that is empty and ready to be programmed in response to determining whether the first region fails the empty page scan operation before performing the empty page scan operation for the second region.

2. The system of claim 1, the operations comprising:
reading one or more signals from the first region;
accessing a read trim value for reading data from the first region;
comparing the one or more signals to the read trim value to generate an error count value comprising computing a quantity of zeros that result from reading the one or more signals; and
comparing the quantity of zeros to a threshold value.

3. The system of claim 2, the operations comprising:
adding an offset to the read trim value based on configuration information associated with the memory subsystem.

4. The system of claim 2, the operations comprising:
in response to determining that the quantity of zeros transgresses the threshold value, determining that the first region is valid for programming; and
performing the empty page scan operation a next region in the order comprising the second region.

5. The system of claim 2, the operations comprising:
in response to determining that the quantity of zeros fails to transgress the threshold value:
determining that the portion of the set of memory components is invalid for programming; and
flagging the identified portion to be refreshed.

6. The system of claim 1, the operations comprising:
identifying a partially programmed block comprising a first set of pages of a plurality of pages that have been programmed; and
selecting a page of the plurality of pages that is adjacent to a last page of the set of pages as the portion of the set of memory components.

7. The system of claim 1, wherein the memory sub-system comprises a three-dimensional (3D) NAND storage device.

8. The system of claim 1, the operations comprising:
accessing configuration information associated with the memory sub-system to identify a set of sub-blocks (SBs) that have an erasure reliability value that is below a threshold.

9. The system of claim 8, wherein the plurality of regions comprises the set of SBs, the operations comprising:
arranging the set of SBs in the order according to the erasure reliability value of the set of SBs; and
performing the empty page scan operation for the set of SBs according to order.

10. The system of claim 9, wherein the identified portion comprises the set of SBs arranged in a predetermined order, and wherein the order in which the set of SBs is arranged for performing the empty page scan operation differs from the predetermined order in which the set of SBs is arranged.

11. The system of claim 1, the operations comprising:
accessing configuration information associated with the memory sub-system to identify a predetermined sequence in which a set of sub-blocks (SBs) is programmed with data.

12. The system of claim 11, wherein the plurality of regions comprises the set of SBs, the operations comprising:
arranging the set of SBs in the order according to the predetermined sequence in which the set of SBs is programmed with data; and
performing the empty page scan operation for the set of SBs according to order.

13. The system of claim 1, wherein the operations comprise:
accessing configuration information associated with the memory sub-system to identify a set of word lines (WLs) that have an erasure reliability value that is below a threshold.

14. The system of claim 13, wherein the plurality of regions comprises the set of WLs, the operations comprising:
arranging the set of WLs in the order according to the erasure reliability value of the set of WLs; and
performing the empty page scan operation for the set of WLs according to order.

15. The system of claim 1, wherein the plurality of regions comprises different planes.

16. The system of claim 1, wherein the plurality of regions comprises different memory dies.

17. A method comprising:
in response to a request to perform an empty page scan operation, identifying a portion of a set of memory components that is empty and ready to be programmed;
generating an order in which to perform the empty page scan operation for a plurality of regions of the identified portion of the set of memory components;
determining whether a first region of the plurality of regions in the order fails the empty page scan operation before a second region of the plurality of regions is scanned; and
terminating the empty page scan operation early to prevent performing the empty page scan operation for one or more remaining regions of the plurality of regions of the identified portion of the set of memory components that is empty and ready to be programmed in response to determining whether the first region fails the empty page scan operation before performing the empty page scan operation for the second region.

18. The method of claim 17, comprising:
reading one or more signals from the first region;
accessing a read trim value for reading data from the first region;
comparing the one or more signals to the read trim value to generate an error count value comprising computing a quantity of zeros that result from reading the one or more signals; and
comparing the quantity of zeros to a threshold value.

19. The method of claim 18, comprising:
in response to determining that the quantity of zeros transgresses the threshold value, determining that the first region is valid for programming; and
performing the empty page scan operation a next region in the order comprising the second region.

20. A non-transitory computer-readable storage medium comprising instructions that, when executed by a processing device, cause the processing device to perform operations comprising:
in response to a request to perform an empty page scan operation, identifying a portion of a set of memory components that is empty and ready to be programmed;

generating an order in which to perform the empty page scan operation for a plurality of regions of the identified portion of the set of memory components;

determining whether a first region of the plurality of regions in the order fails the empty page scan operation before a second region of the plurality of regions is scanned; and terminating the empty page scan operation early to prevent performing the empty page scan operation for one or more remaining regions of the plurality of regions of the identified portion of the set of memory components that is empty and ready to be programmed in response to determining whether the first region fails the empty page scan operation before performing the empty page scan operation for the second region.

\* \* \* \* \*